United States Patent [19]

Morris et al.

[11] Patent Number: 4,830,976

[45] Date of Patent: May 16, 1989

[54] INTEGRATED CIRCUIT RESISTOR

[75] Inventors: Bernard L. Morris, Allentown; Pa.

[73] Assignee: American Telephone and Telegraph Company, AT&T Bell Laboratories, Murray Hill, N.J.

[21] Appl. No.: 16,455

[22] Filed: Feb. 24, 1987

Related U.S. Application Data

[63] Continuation of Ser. No. 685,990, Dec. 24, 1985, abandoned, which is a continuation of Ser. No. 656,343, Oct. 1, 1984, Pat. No. 4,645,948.

[51] Int. Cl.$^4$ .......... H01L 21/265

[52] U.S. Cl. .......... 437/47; 437/60; 437/918

[58] Field of Search .......... 148/DIG. 136; 437/47, 437/60, 918

[56] References Cited

U.S. PATENT DOCUMENTS

| | | | |
|---|---|---|---|
| 3,328,685 | 6/1967 | Hewlett | 324/62 |
| 3,483,464 | 12/1969 | Embree et al. | 323/22 |
| 3,759,762 | 9/1973 | Barone et al. | 437/12 |
| 3,813,595 | 5/1974 | Sheng | 323/4 |
| 3,860,465 | 1/1975 | Matzner et al. | 156/8 |
| 3,875,430 | 4/1975 | Prak | 307/297 |
| 4,009,432 | 2/1977 | Dingwall et al. | 323/4 |
| 4,051,392 | 9/1977 | Rosenthal et al. | 307/297 |
| 4,053,915 | 10/1977 | Cave | 357/22 |
| 4,110,776 | 8/1978 | Rao et al. | 357/23 |
| 4,207,537 | 6/1980 | Cave et al. | 330/253 |
| 4,287,438 | 9/1981 | Cave et al. | 307/297 |
| 4,419,808 | 12/1983 | Tam et al. | 437/47 |
| 4,554,729 | 11/1985 | Tanimura et al. | 437/47 |

FOREIGN PATENT DOCUMENTS

| | | | |
|---|---|---|---|
| 56-43749 | 4/1981 | Japan | 437/918 |
| 56-83964 | 7/1981 | Japan | 437/918 |
| 58-166757 | 10/1983 | Japan | 437/918 |
| 59-161857 | 9/1984 | Japan . | |

OTHER PUBLICATIONS

"Temperature and Power Supply Stable Current Source", Kim-Kimany Case 3-2 Application, Ser. No. 593,522, filed 3-26-84, pp. 1-12, 1 drawing.

"A Simple NMOS Constant Voltage and Current Source", Microelectronics Journal, vol. 14, No. 4, M. R. Haskard, 1983, pp. 31-37.

*Introduction to solid State Physics,* Second Edition, C. Kittel, 1956, pp. 365.

"Temperature Dependence of MOS Transistor Characteristics Below Saturation", *IEEE Transactions on Electron Devices,* vol. ED-13, No. 12, L. Vadasz et al, 1966, pp. 863-866.

"Threshold Voltage Variations with Temperature in MOS Transistors" *IEEE Transactions on Electron Devices,* T. A. DeMassa et al, 1971, pp. 386-388.

"Constant Current Source Network" by U. G. Baitinger et al, IBM Technical Disclosure Bulletin, vol. 13, No. 2, 1971, p. 2516.

Designing with Field Effect Transistors Siliconix Inc., McGraw Hill, 1981, p. 138.

Krick et al., IBM Tech. Disc. Bull., V. 15, No. 6 (Nov. 1972) pp. 1884-1885.

Bleher et al., IBM Tech. Disc. Bull., V. 13, No. 6 (Nov. 1970), pp. 1441.

*Primary Examiner*—Olik Chaudhuri

*Attorney, Agent, or Firm*—James H. Fox

[57] ABSTRACT

An integrated circuit comprises a resistor that is formed by doping a semiconductor region that is defined by a layer, typically polysilicon, that also defines the gate electrode of field effect transistors in the integrated circuit. The well-controlled linewidth of features defined in this layer provides for tight resistor tolerance, and also allows the value of the resistor to track changes in other features defined by this layer.

5 Claims, 7 Drawing Sheets

FIELD OXIDE DEFINED RESISTOR, TOP VIEW
(PRIOR ART)

FIELD OXIDE DEFINED RESISTOR, CROSS SECTION
(PRIOR ART)

POLY DEFINED RESISTOR, TOP VIEW

NOMINAL POLY

WIDE POLY

INTEGRATED CIRCUIT RESISTOR

CROSS-REFERENCE TO RELATED APPLICATION

This application is a continuation of application Ser. No. 685,990, filed Dec. 24, 1985, now abandoned, which is a continuation in part of Ser. No. 656,343, now U.S. Pat. No. 4,645,948.

BACKGROUND OF THE INVENTION

1. Field of the Invention

This invention relates to a technique for forming an integrated circuit that includes a resistor.

2. Description of the Prior Art

Most linear circuits are biased by means of a current source. It is usually thought desirable that this source provide a current that is independent of temperature, power supply, and process variations. One current source in common use takes advantage of the logarithmic insensitivity of a bipolar transistor's forward base-emitter voltage, VBE, to power supply and process variations. A resistor placed across the emitter-base junction of an active transistor (FIG. 1) will give a reference current equal to VBE/R. CMOS (Complementary Metal-Oxide-Semiconductor) integrated circuits have also used this technique by taking advantage of the intrinsic bipolar transistor in the CMOS structure. Unfortunately, this current source has a large temperature dependence, since VBE has an intrinsic negative temperature coefficient of approximately −2 mv/degree C., and the resistor has a positive temperature coefficient. Hence, the current from this source has a large negative temperature coefficient.

A great deal of work has been done on circuits that provide a constant reference voltage, but relatively less on the apparently similar job of producing a constant reference current. In the case of field effect transistor (FET) current sources, steps are frequently taken to mitigate the effects of large lot-to-lot variations in device parameters, for which field effect transistors are notorious. In particular, circuits are usually designed to minimize the effects of threshold and gain variations that occur for field effect transistors on different wafers. For example, a resistor is typically included in the source path of a FET to provide degenerative feedback, which reduces these variations.

SUMMARY OF THE INVENTION

We have invented a technique for implementing a constant current source using a field effect transistor. In this technique, a reference field effect transistor has a resistor connected between the gate and source electrodes. Means are included to cause a reference current to flow in the reference resistor, and be proportional with the channel current of the reference transistor. The reference current can be made to have a positive, negative, or zero temperature coefficient. When utilized with analog or digital field effect transistor circuitry implemented on the same semiconductor substrate, the reference circuit also compensates for processing variations. In a preferred embodiment, the field effect transistor is an enhancement mode type.

DETAILED DESCRIPTION

The following description relates to a circuit which can provide a temperature and power supply independent current, and in a preferred embodiment actively compensates for inherent process variations. This results in a smaller spread of linear circuit parameters, such as operational amplifier slew rate, gain, and gain-bandwidth, than can be obtained with an "ideal" current source. The present technique results in part from a recognition that positive and negative temperature coefficient terms can be balanced to a desired degree in a FET, to obtain a desired temperature coefficient. The present invention also provides that the current source FET may be fabricated by the same fabrication process (e.g., on the same semiconductor substrate) as the circuits utilizing the controlled current. Then, process variations produce changes in the current source FET that offset changes in performance parameters (e.g., gain, slew rate, etc.) in the controlled circuit. By this technique, a FET is utilized to good advantage as a current source.

Figure 1:
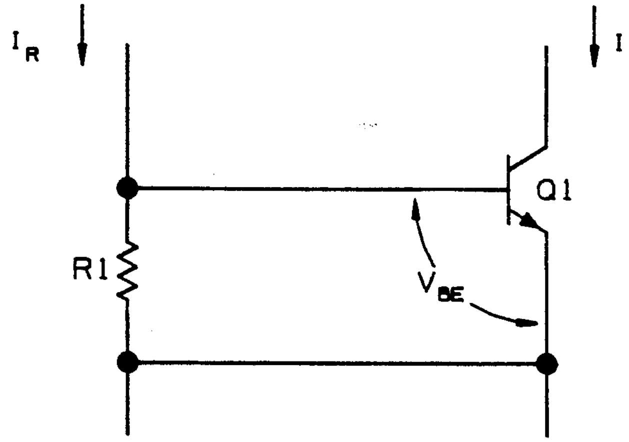
FIGURE 1 (PRIOR ART)
FIG. 1 illustrates a prior-art bipolar current source.
Figure 2:
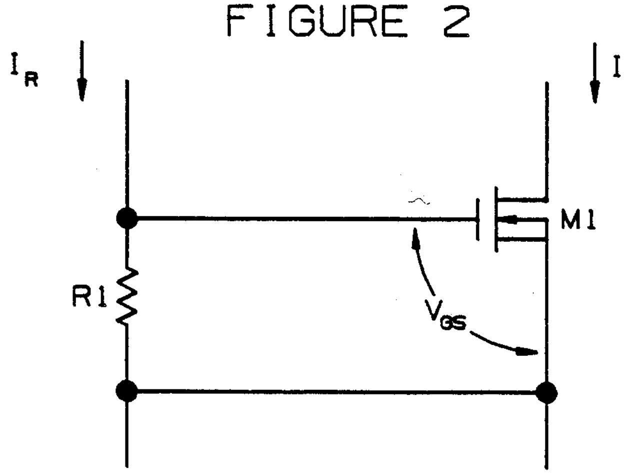
FIG. 2 illustrates a field effect transistor current source reference circuit according to the present invention.

The basic core of the source is shown in FIG. 2, wherein a field effect transistor has a reference resistor (R) connected between the gate and the source. The field effect transistor is typically an insulated gate type (i.e., an IGFET), which may be a metal-oxide-silicon field effect transistor (MOSFET) type. In the saturation region, the current through the channel of the IGFET is:

$$I=\tfrac{1}{2}\beta(VGS-Vt)^2 \quad (1)$$

where $\beta$ is the gain, and Vt is the threshold voltage, of the IGFET. For a MOSFET, the gain ($\beta$) may be approximated as $\beta=(Z/L)\mu$ Cox, wherein Z is the width of the channel, L is the length of the channel, $\mu$ is the mobility of majority carriers in the channel, and Cox is the gate capacitance per unit area. The value of Cox can be calculated as: The permittivity of free space times the dielectric constant of the gate insulator (about 3.85 for an oxide) divided by the thickness of the gate insulator. Equation (1) may be solved for VGS:

$$VGS=(2I/\beta)^{\frac{1}{2}}+Vt. \quad (2)$$

For a constant channel current I, the temperature coefficient of VGS is the sum of two terms. The first involves $\beta$, whose temperature dependence arises from that of the mobility of the majority carriers flowing in the channel between the source and the drain. The mobility ($\mu$) is limited by lattice scattering, which has a temperature dependence of:

$$\mu = \mu_o (T/To)^{-3/2} \quad (3)$$

where $\mu_o$ is the mobility at temperature To. Typical values of $\mu_o$ range from 520 to 775 $cm^2$/volt-sec for n-channel FET's, and from 185–240 $cm^2$/volt-sec for p-channel FET's, at To=20° C. In practice, surface scattering changes the exponent somewhat from its theoretical value of −3/2.

The threshold voltage (Vt) has an intrinsic negative temperature coefficient that depends only weakly on process parameters. For a typical Complementary MOS (CMOS) technology based upon 3-5 micrometer design rules, this value is −2.3 mv/degree C. Equation (2) can now be written as:

$$VGS = Vt + (2I/\beta_o)^{\frac{1}{2}} (T/To)^{\frac{3}{4}}. \quad (4)$$

Note that $\beta_o$ is the gain at temperature To. It is now apparent that VGS is the sum of two terms with opposing temperature coefficients; that of $\beta$o being positive, and Vt being negative. In addition, the magnitude of the second term in Equation (4) depends on the channel current, so that the total temperature coefficient of VGS can easily be adjusted. (A complete analytical treatment is included in the Appendix.) Since the reference current $I_R$=VGS/R, it is apparent that the desired temperature coefficient of the reference current can be obtained by choosing one or more of: the threshold voltage (Vt), the channel current (I), and the gain ($\beta$). The gain in turn can be set according to considerations known in the art, including, for example, the approximation given above.

The ability of this source to compensate for process variations is also shown in Equation 4. A "fast" (e.g., relatively thin gate oxide and short channel length) process will have a large $\beta$, and thus a small value of VGS. The reference current ($I_R$) is equal to VGS/R, so it will decrease. A "slow" (e.g., relatively thick gate oxide and long channel length) process with a small $\beta$ will have a larger VGS, and thus a larger reference current. In terms of the physical process, a fast process usually results from relatively more etching of the gate material, which reduces its length relatively more than its width. Hence, when the channel is formed, the ratio Z/L is increased. The opposite is true for a slow process. Other factors may also be involved, such as semiconductor junction depths, gate insulator thicknesses, doping levels, etc.

Figure 3:
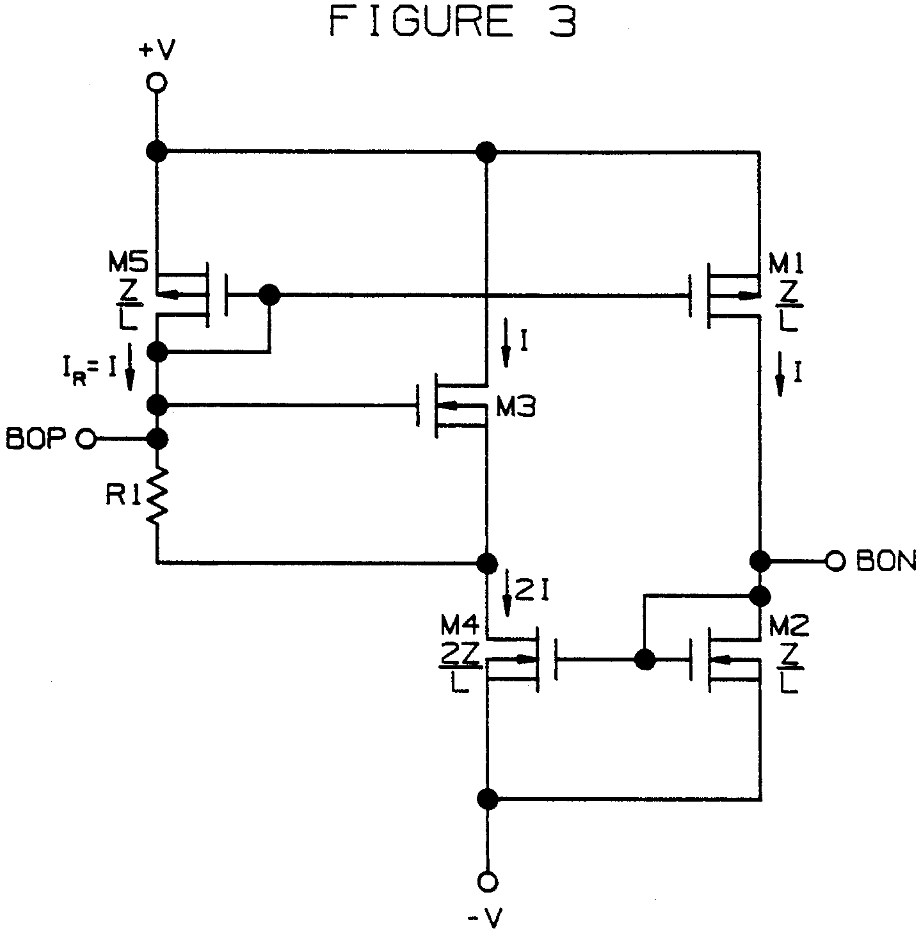
FIG. 3 illustrates a first circuit for implementing the present invention.

A simple circuit that uses the VGS/R concept to generate a constant current is shown in FIG. 3. To obtain a desired temperature coefficient (TC), the channel current through the reference transistor (M3) should be held proportional to the reference current ($I_R$). For this purpose, transistor M1 mirrors the channel current in M5, which is connected as a diode. Note that M5 also causes the reference current $I_R$ to flow through R1. Hence, $I_R$ is identical to the channel current flowing through M5. If a current I is flowing in M1 and M5, then current 2I is mirrored in M4, which is twice the size of M2. The channel current in reference transistor M3 is equal to that in M4 minus that delivered by M5. The final result is that a current I flows through all the transistors except M4, which has a current of 2I. Since the channel current through M3 is forced to be equal to the reference current in R1, a stable feedback loop is formed. Then, the current mirrors are means for causing the channel current (I) in the reference transistor (M3) and the reference current ($I_R$) through the reference resistor (R1) to be proportional. In general, these currents need not be equal, but merely proportional. Thus, $I > I_R$, $I = I_R$, and $I < I_R$ are all possible design variations.

Figure 5:
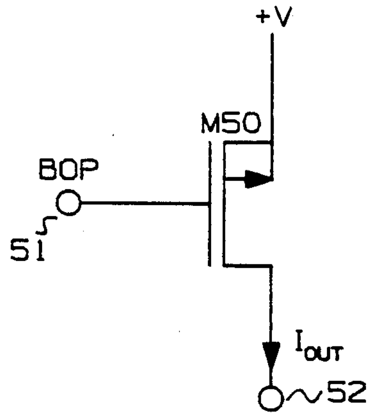
FIGS. 5 and 6 show controlled transistors for implementing current sources relative to positive and negative voltage terminals, respectively.
Figure 6:
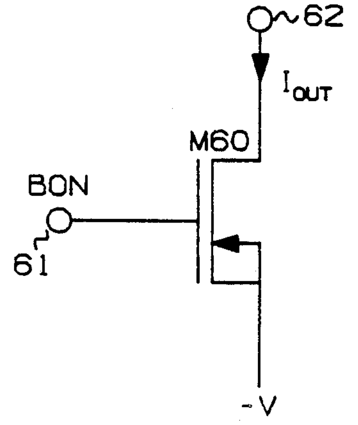

Two output bias voltages are available from this circuit. The bias-out positive (BOP) provides a voltage to the gate of one or more P-channel current output transistors M50; see FIG. 5. The output current, $I_{out}$, is proportional to the reference current, $I_R$. The proportionality constant depends upon the size of M50 as compared to M5 of FIG. 3 (or as compared to M48 of FIG. 4). A corresponding bias-out negative (BON) can be supplied to one or more N-channel current output transistors M60; see FIG. 6. However, the circuit of FIG. 3 has two stable current states, one of them I=0. Hence it is desirable to include means to prevent the circuit from reaching the I=0 state.

Figure 4:
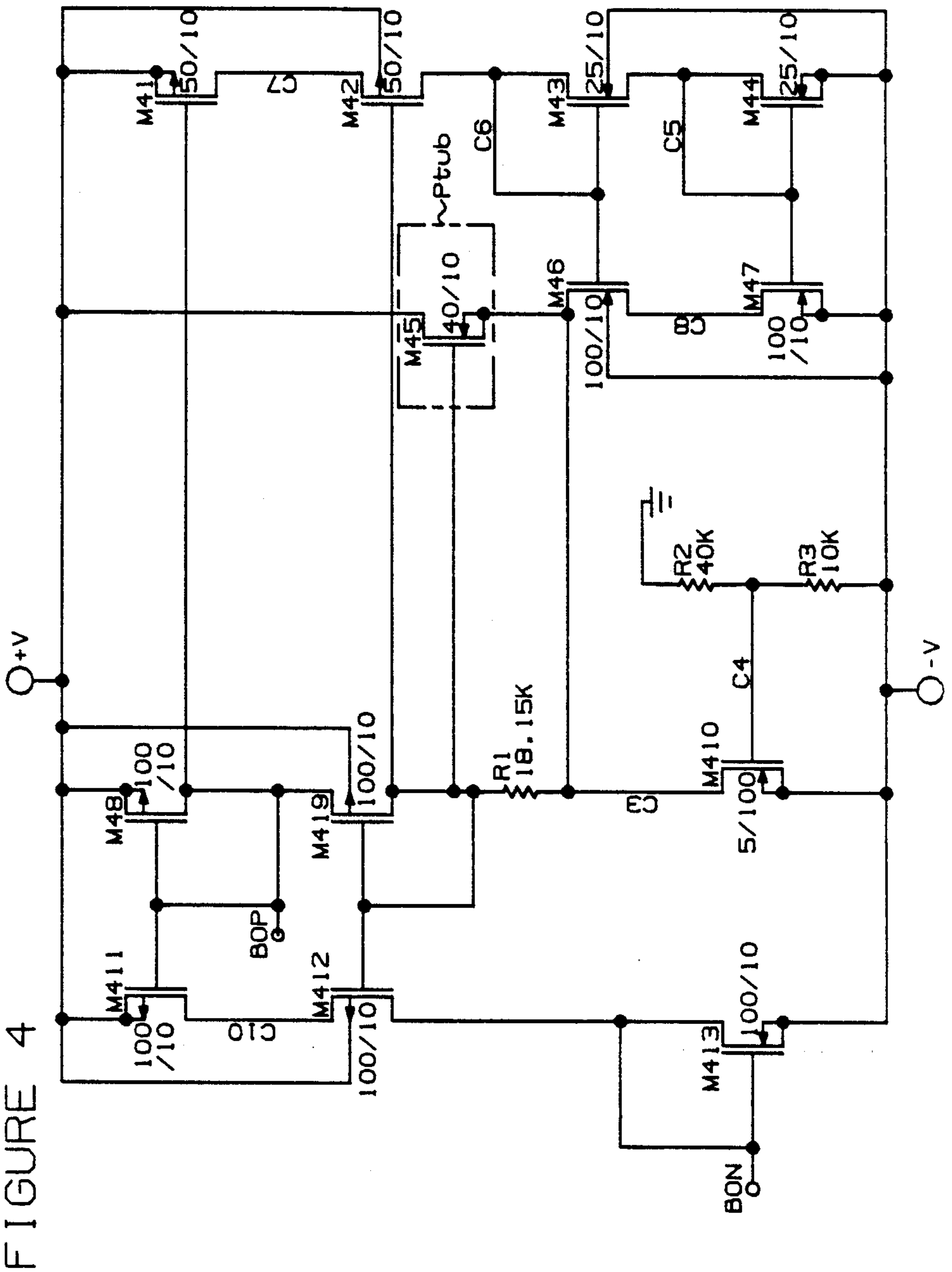
FIG. 4 illustrates a second circuit for implementing the present invention.

A more typical circuit employing the inventive concept is shown in FIG. 4. The widths and lengths of the transistor channels, in micrometers, is given as W/L for each associated transistor. Transistor M410 and its bias resistors are included to provide proper start-up conditions; i.e., prevent I=0. For this purpose, M410 is sized to draw a small current, typically less than 0.1% of the current through reference resistor R1, which is set at a nominal value of 100 $\mu$a. M410 and its bias resistors can be replaced by a depletion transistor. The other additional transistors are optionally included to improve power supply rejection by cascading all of the mirrors, and to mirror the current to M413, which actually drives the negative bias output (BON). A positive bias output (BOP) is provided from the drain of M48.

The reference resistor R1 can be of any type that gives a positive temperature coefficient of resistance. It is advantageously made with a P+ diffusion, which has a much lower TCR (temperature coefficient of resistivity) and VCR (voltage coefficient of resistivity) than the P-tub. The absolute control of the P+ sheet resistance is also very good, typically within plus or minus 15% of the nominal value. R1 can alternately be made of polysilicon or other material. The sizes of R1 and reference transistor M45 are typically set to give a zero TCC (temperature coefficient of current) in M413 and M48 at nominal conditions. The resistance of the reference resistor (R1) is typically greater than 100 ohms, and typically less than 10 megaohms, although a wider range is possible. The size of the reference transistor (M45) is desirably chosen so that the channel length (L) is large enough to minimize processing variations. A length of about 8 to 10 micrometers is suitable for typical processing conditions. Then, the gain may be set by choosing the width, Z, to give the desired temperature coefficient. One methodology for obtaining the desired temperature coefficient of the current from the source is as follows:

1. Determine the temperature coefficient of the reference resistor (e.g., by measurement or estimates based on material type).

2. Choose a desired reference current (e.g., $I_R$=100 microamps) and a desired proportionality between channel current in the reference transistor to the reference current (e.g., $I/I_R$=1).

3. Estimate the approximate size of the reference transistor (e.g., W=50 micrometers, L=10 micrometers).

4. Determine Vt and $\beta$ for the reference transistor thus selected.

5. Determine VGS for the reference transistor, as from equation (2) (e.g., VGS=1.7 volts).

6. Set reference resistor $R=VGS/I_R$ (e.g., $1.7/100\times10^{-6}=17K$).

7. Calculate the temperature coefficient of the reference current: (i.e., $I_R=VGS/R$) from 1 above and equation (2).

8. If the $I_R$ temperature coefficient is not within desired limits, change a variable reflected in equation (2), and repeat steps 3–7 until desired value obtained (e.g., decrease size of reference transistor to W=40 micrometers L=10 micrometers, which reduces the value of $\beta$, and increases VGS to 1.815 volts, so that R=18.15K, which produces approximately zero T.C. for $I_R$.

Note that a positive, zero, or negative T.C. for $I_R$ can be thus obtained. Other methodologies are also possible.

Note that in FIG. 4, the reference transistor M45 as shown is in its own P-tub, with the back-gate bias, VBS=0. This is desirable to minimize power supply induced variations on the back gate. For this reason, the circuit performance is typically better in CMOS than it would be in NMOS. If a CMOS technology using isolated N-tubs were used, the entire circuit would simply be "flipped" over vertically, and M45 would be a P-channel device in an isolated N-tub. However, the present technique can also be usefully implemented in NMOS (or PMOS) technology, when isolated tubs are not available. In that case, the backgate of the current control transistor is then connected to the semiconductor substrate, which is connected to the negative (N-channel) or positive (P-channel) power supply terminal.

To compare the present technique with prior art techniques, computer simulations were done on four different current sources. The nominal current at 25° C. was set at 100 μa for all four sources. The effect of temperature on these sources, as well as process variations for both low speed (worst-case slow) and high speed (worst-case fast) conditions, were investigated. The four sources were as follows:

Source A 100 μa ideal source

Source B Band-gap source, I=VBG/R, VBG=1.2 volts

Source C VBE/R source

Source D VGS/R source (FIG. 4)

In sources B–D, the resistor R was assumed to be made with P+ diffusion, and to have a plus or minus 15% maximum variation with processing.

Varying the temperature from 0° to 100° C. showed that the VBE/R source has by far the largest temperature variation. However, the band-gap source (B) also has an appreciable TCC due to the finite TCR of the resistor. The self-compensating feature of the VGS/R source was apparent. At 25°, the low speed process gives 35% higher current, and the high speed process 30% lower current than nominal. Both cases show a larger TCC than exists with the nominal process, but no worse than that of the band-gap source (B).

The effect of the different current sources on the performance of a typical operational amplifier (op-amp) has also been investigated. The op-amp used in these simulations was a simple two stage design. There are two independent effects of temperature on op-amp performance. The first is the intrinsic effect of temperature on the op-amp, independent of current. The second is the effect of current variations due to the temperature dependence of the current source. The ideal current source (A) is used in these simulations to separate these two effects. The slew rate, gain-bandwidth product (GBW), and gain, as a function of temperature, were investigated for nominal processing at a constant current of 100 μa.

The effect of current variation on these same parameters was also investigated for "worst case (W-C) fast" and "worst case (W-C) slow" conditions, as follows:

| Condition | Transistors | Resistors | Temperature |
|---|---|---|---|
| W-C Fast | Fast | 15% Low | 0 Degrees C. |
| W-C Slow | Slow | 15% High | 100 Degrees C. |

The minimum and maximum values, and the total spread expressed as a % of the median value of the three parameters, are summed up in Table I.

TABLE I

Maximum, minimum, and total spread of slew rate, GBW, and gain of an op-amp under worst case fast and worst-case slow conditions:

| CURRENT SOURCE | SLEW RATE (v/us) Min. | Max. | Spread (%) | GBW (MHz) Min. | Max. | Spread (%) | GAIN (dB) Min. | Max. | Spread (%) |
|---|---|---|---|---|---|---|---|---|---|
| A. Constant | 10.3 | 13.5 | 27 | 3.83 | 6.95 | 58 | 63.6 | 70.5 | 10.4 |
| B. Band-Gap | 9.2 | 15.5 | 49 | 3.58 | 7.36 | 69 | 63.1 | 71.3 | 12.1 |
| C. VBE/R | 7.5 | 16.1 | 73 | 3.52 | 7.63 | 73 | 62.7 | 72.3 | 14.3 |
| D. VGS/R | 11.6 | 12.8 | 10 | 4.08 | 6.66 | 48 | 63.9 | 69.6 | 8.6 |

The performance improvement is most noticeable in those parameters which have the strongest dependence on current, but in all cases the VGS/R source results in a higher minimum value and a lower maximum value. Some insight as to the relative effects of temperature and process variations can be gained by independently varying these inputs while keeping the reference current set at 100 μa. The results are shown in Table II. Both the slew rate and gain are more strongly effected by the process variations than by temperature, while the GBW is equally effected.

TABLE II

Total variations in op-amp performance due to (1) a 100° C. temperature variation, and (2) the difference between "fast" and "slow" transistor processing, with the reference current held at 100 μa:

| PARAMETER | VARIATION DUE TO TEMPERATURE (%) | VARIATION DUE TO PROCESSING (%) |
|---|---|---|
| Slew Rate | 7.8 | 15.5 |
| Gain | 1.3 | 13.8 |
| GBW | 27.0 | 28.0 |

Among the other parameters of interest in op-amps and other linear circuits are power supply rejection ratio (PSRR), common mode rejection ratio (CMRR), and common mode range. Computer simulations show that the inventive supply is slightly better than the others in both PSRR and CMRR. The common mode range, however, is somewhat worse. This is due to exactly the self-compensating feature that improves the other parameters. The smallest common mode range exists when the transistors are slow and the current is high. In other current sources there is no connection between these two; even when the worst-case assumption of high current is made, it is not as high as it is in the self-compensating source. For the op-amp used here, this results in a worst-case loss of 500 mv of input range. This op-amp was not designed to give a particularly large common mode range, and the loss would be proportionally less on op-amps with larger Z/L ratios on the input transistors.

Figure 7:
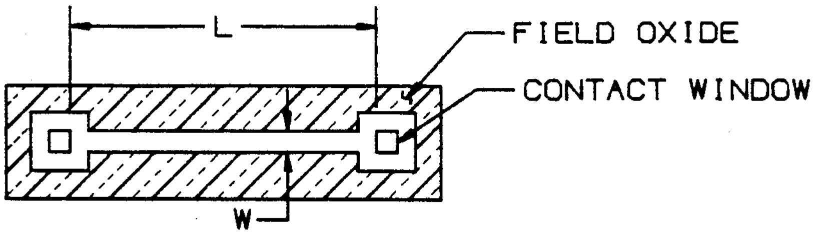
FIGS. 7 and 8 illustrate a prior art current source reference resistor.
Figure 8:
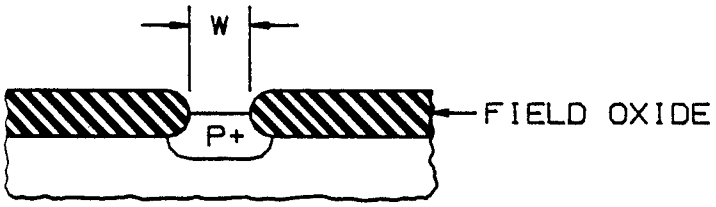

All of the discussion and results up to this point has assumed that the value of the reference resistor R1 in the inventive current source is independent of the transistor process. This is a good assumption for resistors made in the usual manner, as shown in FIGS. 7 and 8. In this technique, an opening etched in the field oxide allows the resistor to be formed by doping (as by ion implantation) the semiconductor in the region thus defined. For the resistor shown in FIG. 7, the total resistance is:

$$R=Rs(L/W) \quad (5)$$

where Rs is the sheet resistance of the doped semiconductor, and L and W are the length and width of the field oxide defined opening. An insulating layer (e.g., a glass), is typically deposited over the resistor, with contact windows then etched therethrough.

Figure 9:
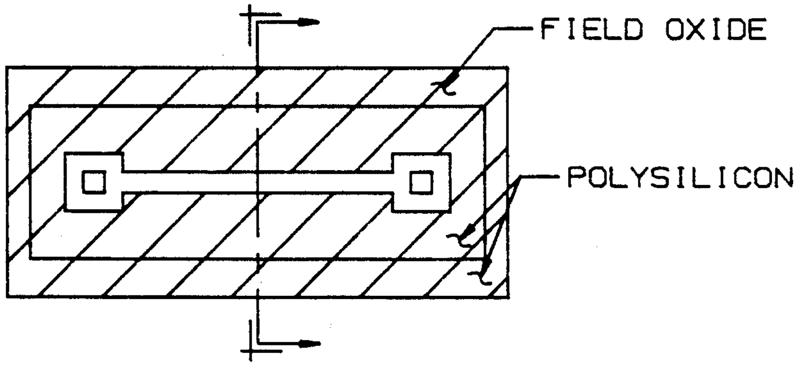
FIGS. 9, 10, and 11 illustrate an inventive current source reference resistor.
Figure 10:
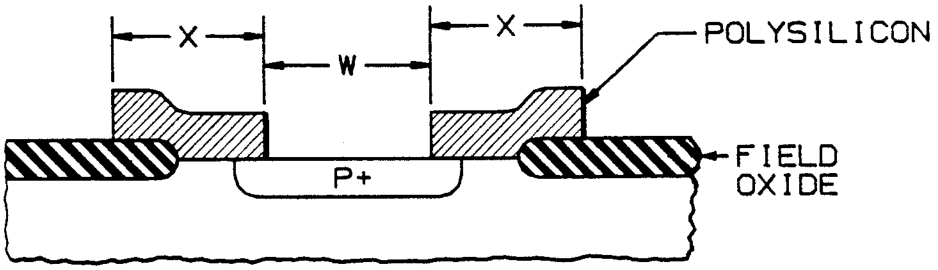
Figure 11:
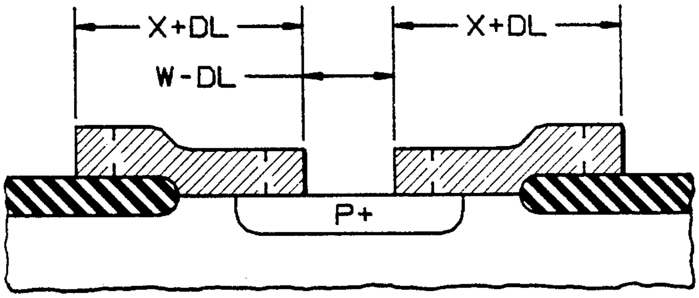

Another way to define the resistor is shown in FIGS. 9 and 10. In this case, the polysilicon (poly) level is used instead of the field oxide to define the feature size. The poly line size is one of the most critical and well controlled parameters in the process, and in self-aligned silicon gate technology, the polysilicon layer defines the gate electrode size. Hence, the poly line size will often determine whether any given wafer is "slow" or "fast". For this reason, a resistor defined by the layer that defines the gate electrode can have a tighter design tolerance than one defined by the field oxide. Let us assume that the actual poly line size differs from the nominal size by an amount DL. A positive DL means wider poly and a slower process, negative DL means narrow poly and a fast process. As shown in FIG. 11, the resistor width is W-DL, so that:

$$R=Rs(L/W\text{-}DL)) \quad (6)$$

A positive DL (slow process) causes the resistor to increase, and the negative DL (fast process) causes it to decrease from the design value. This will oppose the "self-compensation" feature of the VGS/R source, since process induced changes in VGS will now be tracked by a similar change in R. The relative value of these two quantities depends on the resistor's nominal width. For an extremely wide resistor, R does not depend on DL at all. As the resistor width decreases, the effect of DL becomes larger. Note that other self-aligned gate electrode materials (e.g., a refractory metal or metal silicide) can be used to define the resistor, to achieve this effect.

Figure 12:
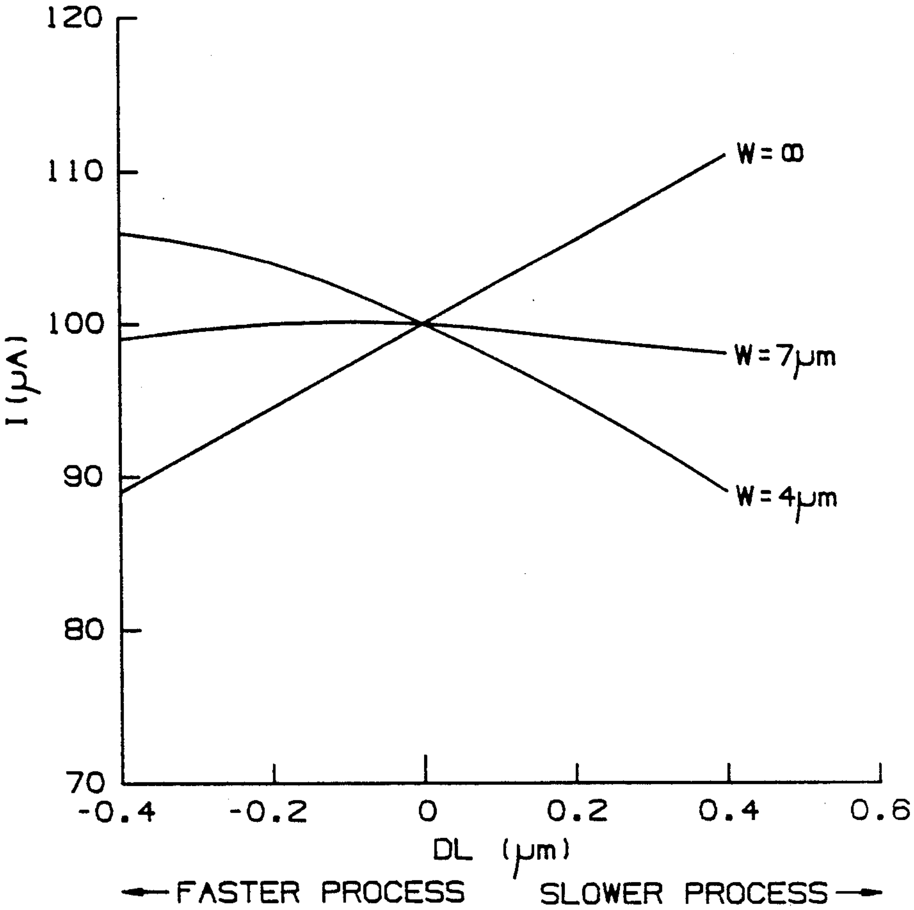
FIG. 12 illustrates the effect of process variations on current source output for reference resistors of differing widths for the resistor type shown in FIGS. 9–11.

The current I=VGS/R for three different resistor widths is shown in FIG. 12. It was calculated using the 40/10 N-channel transistor M45 in FIG. 4 and nominal process conditions. The case of infinite resistor width corresponds to the case discussed above. At 7 microns the current is nearly independent of poly line size, and at 4 microns the process compensation is actually the reverse of that discussed above.

The circuit shown in FIG. 4 has been implemented in a typical 3.5 micron Twin-Tub CMOS process on a n-type substrate on a lot in which the poly width was intentionally varied. The resistor R1 was poly defined, with a nominal width of 4 microns. The current vs. temperature curves for three different wafers were determined. The sheet resistance of the P+ diffusion, was measured at 10 percent below the nominal value for this lot. This accounts for most of the difference between the measured current of 107 μa and the design value of 100 μa for the nominal poly. For a wafer with a measured DL=+0.44 μm, the current calculated from FIG. 12 was 87% of the nominal value, and the measured current was 84% of the nominal. For a wafer with a measured DL=−0.22 μm, the calculated current was 105% nominal, and the measured current was 114% of the nominal. For the nominal poly, the maximum variation of current over the temperature range 10° C.-120° C. was 2.1%. From 25° C.-120° C. it is 1.5%. Both the narrow and wide poly had similar temperature variations of their current.

The foregoing has shown that in the present technique the temperature coefficient of current can be selected to be either zero (nominally, as second order effects give a slight curvature), positive, or negative. If a zero temperature coefficient of current is desired, the resulting controlled current can be readily maintained within ±5 percent, and typically within ±2 percent, of the average value, over a temperature range of from 0° C. to 100° C., or even wider. These values are even more readily obtained over a typical commercial temperature range of from 0° C. to 70° C. The current source automatically compensates for variations in the transistor process, with a "fast" process giving lower current and a "slow" one giving a higher current. If desired, this compensation can be reduced or eliminated with respect to variations in the polysilicon line width size by proper resistor design. While the above example has been for an enhancement mode MOSFET, similar considerations apply for depletion mode devices, including junction field effect transistors, and Shottky gate field effect transistors (e.g., MESFETS) implemented in gallium arsenide or other III-V materials.

However, one advantage of the present technique is that it does allow the use of enhancement mode FET's; i.e., those having a threshold voltage, Vt, that is >0 for an n-channel device, and Vt <0 for a p-channel device. Note that these voltages are measured at the gate in reference to the source; i.e., VGS. Enhancement mode field effect transistors are typically of the insulated gate (IGFET) type, of which MOSFET's are an example. Their use is advantageous because a smaller channel current can then typically be utilized in the reference transistor than if a depletion-mode device were used. This is because in the present technique, the reference current is directed through the reference resistor in the direction that causes the channel current in the reference transistor to flow (or to increase its flow), as the reference current increases. That is, VGS is generated in the direction of forward bias by the reference current. Hence, the power dissipation can be less with enhancement mode FET's. Furthermore, enhancement mode field effect transistors are usually available on an integrated circuit using fewer process steps then depletion mode devices require. A depletion mode device may be used, however, by operating it in the enhancement mode; i.e., where the channel current is greater in magnitude than the channel current for VGS=0. Note that the means for causing the channel current and the reference current to be proportional (e.g., a current mirror ) inherently produces the desired direction of reference current flow. This is in contrast with the prior art technique of biasing a current source FET using degenerative feedback by placing a resistor in the source path. In that case, an increase in the current through the resistor causes a change in VGS in the direction that tends to decrease the channel current of the FET.

While the present invention may be used in analog integrated circuits, it may also be used in digital integrated circuits. For example, in certain random access memory designs, it is known to use a current source for the sense amplifiers, for improved speed and sensitivity. In addition, the use of a controlled current source is known for use with digital logic circuits to reduce chip-to-chip performance variations. In the past, the current source associated with the logic gates has been controlled using a reference clock and comparator circuitry; see "Delay Regulation-A Circuit Solution to the Power/Performance Tradeoff", E. Berndlmaier et al, *IBM Journal of Research and Development,* Vol. 25, pp. 135–141 (1981). The present invention can advantageously be implemented on the same chip or wafer as the logic gates to perform this function. Since processing conditions are similar for all circuits on a given semiconductor wafer, the present technique lends itself to wafer scale integration uses. If desired, a single bias circuit (e.g., FIG. 4) can provide control of a plurality of current output transistors (FIGS. 5, 6) located at various places on a chip or wafer. The term "integrated circuit" as used herein includes both utilizations. The controlled current from the present source can be used to produce a controlled voltage, as by passing it through a resistor having a given temperature coefficient, or through a resistor-diode combination; i.e., a band-gap reference, etc. The characteristics of a band-gap reference are described in "New Developments in IC Voltage Regulators", R. J. Widlar, *IEEE Journal of Solid State Circuits,* Vol. SC-6, pp. 2-7 (1971). Since the controlled current can have a desired temperature coefficient chosen over a wide range, the resulting voltage can be used for a variety of purposes. Also, the device receiving the controlled current may be formed on a different substrate from the current source. For example, an optical emitter (e.g., light emitting diode or laser diode) can be driven by current supplied from the present source and adjusted so that $I_R$ has a positive T.C., to compensate for the reduction in optical output from the source with increasing temperature. Still other applications will be apparent to a person of skill in the art.

APPENDIX

Referring to the current source shown in FIG. 3; define a reference current $I_R$ as the current through R1, IDS3 as the current through M3 with gate to source voltage VGS3, and $KI_R$ as the current through M4, where K is the feedback constant determined by the relative sizes of M1, M2, M4, and M5. The value of K shown in FIG. 3 is two, but it may be any value consistent with stability.

Summing the currents at the drain of M4 gives:

$$IDS3=(K-1)I_R. \tag{1A}$$

However:

$$I_R = \frac{VGS3}{R1} = \frac{1}{R1}\left|\frac{2IDS3}{\beta}\right|^{\frac{1}{2}} + \frac{V_t}{R1}. \tag{2A}$$

Substituting (1A) into (2A) and rearranging gives:

$$I_R - \frac{1}{R1}\left|\frac{2(K-1)}{\beta}\right|^{\frac{1}{2}}(I_R)^{\frac{1}{2}} - \frac{V_t}{R1} = 0 \tag{3A}$$

which is quadratic in $(I_R)^{\frac{1}{2}}$. Solving gives:

$$(I_R)^{\frac{1}{2}} = \frac{1}{2R1}\left|\frac{2(K-1)}{\beta}\right|^{\frac{1}{2}} \pm \frac{1}{2}\left|\frac{1}{R1^2}\left|\frac{2(K-1)}{\beta}\right| + \frac{4V_t}{R1}\right|^{\frac{1}{2}}. \tag{4A}$$

Squaring and rearranging gives:

$$I_R = \frac{V_t}{R1} + \frac{(K-1)}{R1^2\,\beta}\left|1 \pm \left|1 + \frac{2V_tR1\beta}{(K-1)}\right|^{\frac{1}{2}}\right|. \tag{5A}$$

As can be seen in (5A), there are two real solutions; however, the solution with the negative sign in the bracket is a class of solutions for VGS3<Vt, or zero current through M3. These solutions correspond to loss of regulation in the source.

For $R1\beta/(K-1)>>1$, Equation (5A) reduces to:

$$I_R \approx V_t/R1 \tag{6A}$$

which has an inherent negative temperature coefficient. For $R1\beta/(K-1)<<1$, Equation (5A) reduces to:

$$I_R \approx 2(K-1)/R1^2\beta$$

which has an inherent positive temperature coefficient. Even through $1/R1^2$ has negative temperature behavior, it is outweighed by $1/\beta$ which goes as $T^{3/2}$.

It can also be shown that if at 25° C., $R1\beta/(K-1)\approx 2$, then $$\left.\frac{\delta I_R}{\delta T}\right|_{25^\circ\,C.} \approx 0 \tag{7A}$$

and that $I_R$ at this value of $R1\beta/(K-1)$ varies slowly with temperature.

The temperature behavior of this current source can be varied negative or positive, or made essentially zero, by proper choices of value of the reference resistor, R1, the size of transistor M3, and the value of the feedback constant K. Note that these factors influence the channel current through the reference transistor, as indicated by (1A).

What is claimed is:

1. A method of making an integrated circuit including the step of forming at least one resistor in said integrated circuit, by steps comprising:

forming a layer of conductive material overlying a semiconductor body;

forming a pattern in said layer that defines the gate electrode of at least one field effect transistor formed in said semiconductor body; and introducing a dopant into said semiconductor body; characterized in that said layer as patterned includes an opening that allows said dopant to be introduced into a resistor region of said semiconductor body, and said layer as patterned prevents said dopant from being introduced into the region of said semiconductor body immediately surrounding said resistor region.

2. The method of claim 1 wherein said material comprises silicon.

3. The method of claim 2 wherein said silicon is in the form of polycrystalline silicon.

4. The method of claim 1 wherein said material comprises a metal silicide.

5. The method of claim 1 wherein said material comprises a refractory metal.

* * * * *